United States Patent
Heo et al.

(10) Patent No.: US 7,098,123 B2
(45) Date of Patent: Aug. 29, 2006

(54) METHODS OF FORMING A SEMICONDUCTOR DEVICE HAVING A METAL GATE ELECTRODE AND ASSOCIATED DEVICES

(75) Inventors: Seong-Jun Heo, Seoul (KR); Sun-Pil Youn, Seoul (KR); Sung-Man Kim, Gyeonggi-do (KR); Si-Young Choi, Gyeonggi-do (KR); Gil-Heyun Choi, Gyeonggi-do (KR); Ja-Hum Ku, Gyeonggi-do (KR); Chang-Won Lee, Gyeonggi-do (KR); Jong-Myeong Lee, Gyeonggi-do (KR); Kwon-Sun Ryu, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/780,244

(22) Filed: Feb. 17, 2004

(65) Prior Publication Data

US 2005/0020042 A1 Jan. 27, 2005

(51) Int. Cl.
*H01L 21/28* (2006.01)
(52) U.S. Cl. .................................... 438/592
(58) Field of Classification Search ................ 438/201, 438/211, 257, 261, 265, 266, 283, 593, 785, 438/592; 257/315, 412, 915, 316
See application file for complete search history.

(56) References Cited

U.S. PATENT DOCUMENTS

| | | | | |
|---|---|---|---|---|
| 5,576,576 A * | 11/1996 | Hawley et al. | ............. | 257/530 |
| 5,739,066 A * | 4/1998 | Pan | ............. | 438/595 |
| 5,776,823 A * | 7/1998 | Agnello et al. | ............. | 438/592 |
| 5,796,166 A * | 8/1998 | Agnello et al. | ............. | 257/751 |
| 5,925,918 A * | 7/1999 | Wu et al. | ............. | 257/413 |
| 5,998,290 A * | 12/1999 | Wu et al. | ............. | 438/595 |
| 6,075,274 A * | 6/2000 | Wu et al. | ............. | 257/413 |
| 6,177,334 B1 * | 1/2001 | Chen et al. | ............. | 438/584 |
| 6,198,144 B1 * | 3/2001 | Pan et al. | ............. | 257/412 |
| 6,277,722 B1 * | 8/2001 | Lee et al. | ............. | 438/592 |
| 6,288,419 B1 * | 9/2001 | Prall et al. | ............. | 257/213 |
| 6,308,309 B1 * | 10/2001 | Gan et al. | ............. | 716/8 |
| 6,333,250 B1 * | 12/2001 | Kim | ............. | 438/595 |
| 6,380,008 B1 * | 4/2002 | Kwok et al. | ............. | 438/158 |
| 6,514,841 B1 * | 2/2003 | Kim et al. | ............. | 438/592 |
| 6,514,842 B1 * | 2/2003 | Prall et al. | ............. | 438/593 |

(Continued)

FOREIGN PATENT DOCUMENTS

KR 10-2000-0061842 10/2000

OTHER PUBLICATIONS

Notice from Korean Patent Office citing Korean Patent Publication No. 2000-61842, mailing date of Mar. 23, 2005, 2 sheets in English and 2 sheets in Korean.

(Continued)

*Primary Examiner*—Evan Pert
(74) *Attorney, Agent, or Firm*—Myers Bigel Sibley & Sajovec PA

(57) ABSTRACT

Methods of forming a semiconductor device having a metal gate electrode include sequentially forming a gate insulator, a gate polysilicon layer and a metal-gate layer on a semiconductor substrate. The metal-gate layer and the gate polysilicon layer are sequentially patterned to form a gate pattern comprising a stacked gate polysilicon pattern and a metal-gate pattern. An oxidation barrier layer is formed to cover at least a portion of a sidewall of the metal-gate pattern.

24 Claims, 2 Drawing Sheets

U.S. PATENT DOCUMENTS

| | | | |
|---|---|---|---|
| 6,713,342 B1* | 3/2004 | Celii et al. | 438/239 |
| 6,717,196 B1* | 4/2004 | Joo | 257/295 |
| 6,717,197 B1* | 4/2004 | An | 257/295 |
| 6,800,890 B1* | 10/2004 | Wohlfahrt et al. | 257/295 |
| 6,815,227 B1* | 11/2004 | An | 438/3 |
| 6,844,252 B1* | 1/2005 | Pan | 438/595 |
| 6,849,544 B1* | 2/2005 | Weimer et al. | 438/656 |
| 6,876,021 B1* | 4/2005 | Martin et al. | 257/295 |
| 6,887,720 B1* | 5/2005 | Joo | 438/3 |
| 6,940,111 B1* | 9/2005 | Bruchhaus et al. | 257/295 |
| 2002/0048920 A1* | 4/2002 | Pan | 438/595 |
| 2002/0063283 A1* | 5/2002 | Pan et al. | 257/344 |
| 2004/0104754 A1* | 6/2004 | Bruchhaus et al. | 327/294 |
| 2004/0203222 A1* | 10/2004 | Pyi | 438/592 |
| 2005/0111248 A1* | 5/2005 | Pan | 365/49 |
| 2005/0133876 A1* | 6/2005 | Bu et al. | 257/408 |

OTHER PUBLICATIONS

Notice from Korean Patent Office for the corresponding Korean Patent Application citing Korean Patent Publication No. 102000-61842, mailing date of Sep. 15, 2005, 2 sheets in English and 2 sheets in Korean.

* cited by examiner

METHODS OF FORMING A SEMICONDUCTOR DEVICE HAVING A METAL GATE ELECTRODE AND ASSOCIATED DEVICES

RELATED APPLICATIONS

This application claims priority to Korean Patent Application No. 10-2003-0010403, filed Feb. 19, 2003, the contents of which are hereby incorporated by reference as if recited in full herein.

FIELD OF THE INVENTION

The present invention relates to methods of forming semiconductor devices. More particularly, the present invention relates to methods of forming semiconductor devices having a metal gate electrode.

BACKGROUND OF THE INVENTION

As semiconductor devices become more highly integrated, the size of gate patterns can be reduced which can change an electrical property associated with the gate pattern. For example, where a metal silicide, such as tungsten silicide, is used as a gate pattern, resistance of the gate pattern can increase (sometimes relatively rapidly) as size of the gate pattern is reduced. Thus, in order to adjust for the resistance increase caused by the reduced size gate pattern in a highly integrated semiconductor device, a metal (such as tungsten) having a low resistance can be used to offset the increased resistance caused by the reduced size gate pattern.

FIG. 1 is a cross-sectional diagram of a semiconductor device having a metal gate electrode according to the prior art. Referring to FIG. 1, a gate insulator 3, a gate polysilicon layer 5, a barrier metal layer 7, a metal gate layer 9, and a capping layer 11 are sequentially formed and patterned to form a gate pattern 13. In order to treat etch damage that can occur at the semiconductor substrate 1 and the gate polysilicon layer 5 during the patterning process, a thermal treatment process can be performed in an oxygen environment. At this time, as shown in FIG. 1, oxygen may diffuse through a side surface of the metal gate layer 9 while thermal treating under the oxygen environment, thereby forming an oxide layer "O" at a boundary between the metal barrier layer 7 and the gate polysilicon layer 5. The oxide layer "O" may increase resistance between the metal gate layer 9 and the gate polysilicon layer 5. The increased resistance attributed to the oxide layer may result in one or more of an RC (time constant) delay, a lower operational speed and reliability in a semiconductor device.

SUMMARY

Embodiments of the invention provide methods of forming a semiconductor device that can inhibit and/or prevent oxide formation between a metal gate layer and a gate polysilicon layer in a gate pattern.

Certain embodiments of the invention are directed to methods that include forming an oxidation barrier layer covering at least a portion of a sidewall of a metal gate layer.

In particular embodiments, the method can include: sequentially forming a gate insulator, a gate polysilicon layer and a metal-containing layer on a semiconductor substrate. The metal-containing layer and the gate polysilicon layer can be (sequentially) patterned to form a gate pattern comprising a stacked gate polysilicon pattern and a metal-gate (comprising a metal containing) pattern.

The method can include forming an oxidation barrier layer to cover at least a portion of a sidewall of the metal-containing pattern. In particular embodiments, the oxidation barrier layer can be formed by chemical vapor deposition (CVD) and/or an atomic layer deposition (ALD).

In certain embodiments, the oxidation barrier layer can be deposited on sidewalls of the metal-containing layer with a greater thickness than on surfaces of other layers due to a difference of chemical properties in the material of the other layers, such as nucleation rate.

The oxidation barrier layer may comprise at least one of a metal, an oxide, a nitride or an oxynitride of the metal. In particular embodiments, the metal can be selected from the group consisting of aluminum (Al), tantalum (Ta), titanium (Ti), hafnium (Hf) and gold (Au).

The oxidation barrier layer may be formed by selectively depositing a metal layer onto the sidewall(s) of the metal-gate pattern and then oxidizing or nitrifying the deposited metal layer.

In particular embodiments, the oxidation barrier layer may comprise and/or be formed of aluminum oxide ($Al_2O_3$). For example, an aluminum layer can be formed by using a CVD method and by supplying methylpyrrolidine alane (MPA) as a source gas and argon (Ar) of 100 sccm as a carrier gas at a temperature of between about 135~145° C. and at a pressure of between about 0.1~1.1 Torr, and the aluminum layer can be oxidized under an oxygen-enriched environment or ambience.

According to another embodiment of the present invention, the metal-containing layer can be formed of a barrier metal layer and a metal gate layer that are sequentially stacked. The gate pattern can comprise a gate polysilicon pattern, a barrier metal pattern and a metal gate pattern that are sequentially stacked. In particular embodiments, the metal gate layer can comprise tungsten. The barrier metal layer can comprise tungsten nitride (WN) and/or titanium nitride (TiN). The oxidation barrier layer may be selectively formed to cover substantially only the metal gate pattern.

In certain embodiments, the methods can include forming a capping layer on the metal-containing layer. The capping layer can be patterned when the metal-containing layer and the gate polysilicon layer are sequentially patterned, thereby forming a gate pattern comprising a gate polysilicon pattern, a metal-containing pattern and a capping pattern that are sequentially stacked.

In particular embodiments, a thermal treating process may be subsequently performed with respect to the semiconductor substrate having the gate pattern with the oxidation barrier layer under an oxygen-enriched environment or ambience. The thermal treating process under the oxygen environment may comprise supplying nitrogen as a carrier gas and supplying oxygen and hydrogen at a temperature of between about 750~950° C. with a ratio of oxygen/hydrogen of between about 0.5~1.3.

The oxidation barrier layer can inhibit oxygen penetration into the metal-containing layer so that there is a reduced and/or no formation of a conventional oxide layer between the gate polysilicon pattern and the metal-containing pattern.

Still other embodiments are directed to methods of forming an integrated circuit device having a metal gate electrode. The methods include: (a) forming a stacked gate pattern onto a target substrate, the gate pattern comprising a metal-gate pattern with opposing first and second surfaces and at least one sidewall; and (b) covering at least a portion of the at least one sidewall of the metal-gate pattern with an oxidation barrier layer.

In particular embodiments, the covering of the at least one sidewall of the metal-gate pattern comprises conformably covering substantially the entire outer surface of the sidewall (s) of the metal-gate pattern with the oxidation barrier layer, and, as desired also covering the sidewalls of a barrier metal layer abutting the metal-gate pattern. The gate pattern can be formed so that it is substantially devoid of the oxidation barrier layer proximate to a sidewall of a respective gate polysilicon pattern and a capping pattern.

In certain embodiments, the method can include thermally treating the gate pattern in an oxygen-enriched environment and inhibiting an oxide layer from forming between the metal-barrier layer and the gate polysilicon layer based on the configuration of the oxidation barrier layer.

Other embodiments are directed to highly integrated semiconductor circuit devices with metal gate electrodes and a reduced gate pattern size. The devices include: (a) a substrate; (b) a gate insulation layer disposed over the substrate; (c) a plurality of spaced apart first gate patterns stacked on the gate insulation layer above the substrate; (d) a plurality of corresponding spaced apart metal barrier patterns, a respective one stacked on each of the first gate patterns above the gate insulation layer, the metal barrier patterns having at least one upwardly extending sidewall; (e) a plurality of corresponding second metal gate patterns, a respective one stacked on each of the metal barrier patterns above the first gate layer, the second metal gate patterns having at least one upwardly extending sidewall; (f) a plurality of corresponding capping patterns, a respective one stacked on each of the metal gate patterns above the metal barrier layer; and (g) an oxidation barrier layer conformably disposed over the metal barrier pattern sidewalls and the metal gate pattern sidewalls and being substantially absent on sidewalls of the first gate patterns and the sidewalls of the capping layer pattern. The device is substantially devoid of an oxide layer extending at a boundary portion located between respective metal barrier patterns and the corresponding first gate layers. The oxidation barrier layer may have a thickness of between about 5~100 Å.

The foregoing and other objects and aspects of the present invention are described in greater detail in the drawings herein and the specification set forth below.

DETAILED DESCRIPTION

Figure 1:
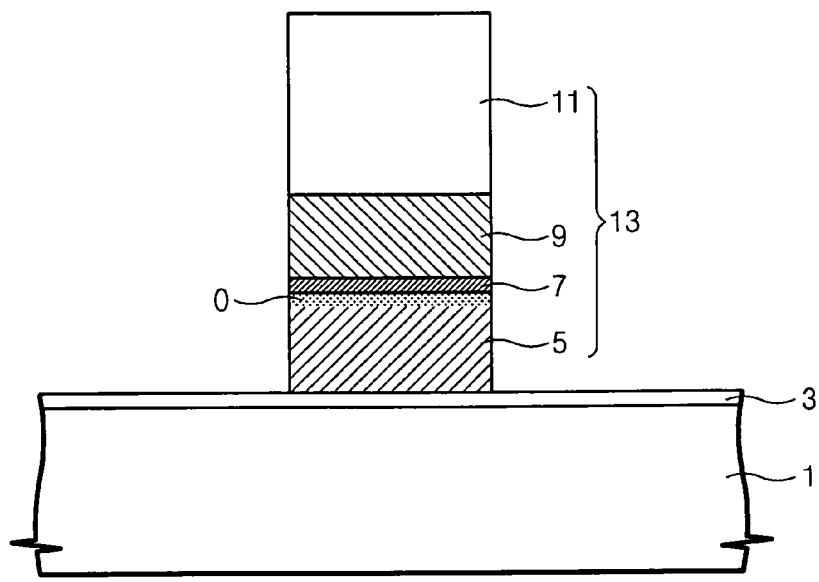
FIG. 1 is a cross-sectional diagram of a prior art semiconductor device having a metal gate electrode according to a conventional technology.

The present invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions may be exaggerated for clarity. It will be understood that when an element such as a layer, region or substrate is referred to as being "on" another element, it can be directly on the other element or intervening elements may also be present.

Furthermore, relative terms, such as "beneath", may be used herein to describe one element's relationship to another elements as illustrated in the figures. It will be understood that relative terms are intended to encompass different orientations of the device in addition to the orientation depicted in the figures. For example, if the device in the figures is turned over, elements described as "below" other elements would then be oriented "above" the other elements. The exemplary term "below", can therefore, encompasses both an orientation of above and below.

It will be understood that although the terms first and second may be used herein to describe various regions, layers and/or sections, these regions, layers and/or sections should not be limited by these terms. These terms are used to distinguish one region, layer or section from another region, layer or section. Thus, a first region, layer or section discussed below could be termed a second region, layer or section, and similarly, a second without departing from the teachings of the present invention. Like numbers refer to like elements throughout. In addition, although described herein with respect to semiconductor substrates and devices, the present invention is directed to integrated circuits and can include structures formed on other substrates.

Figure 2A:
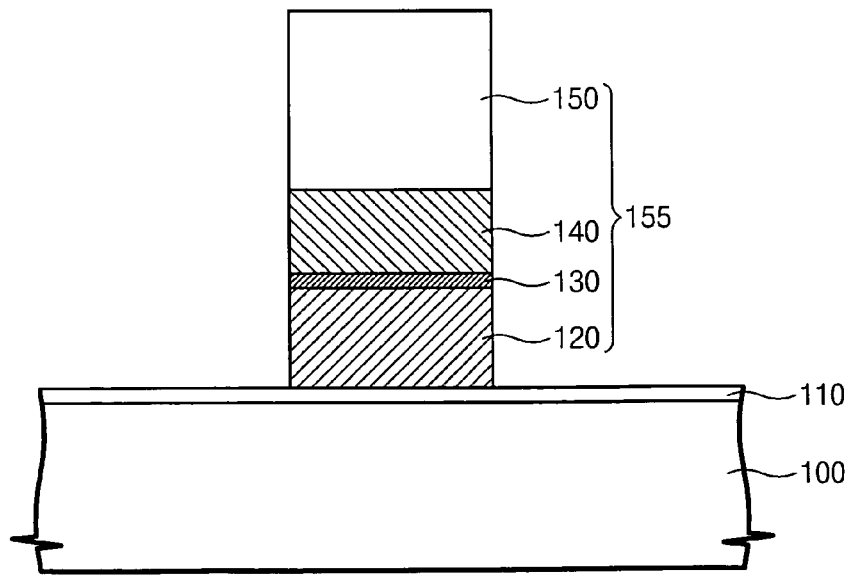
FIGS. 2A through 2C are cross-sectional diagrams sequentially illustrating exemplary operations and/or features for forming a semiconductor device having a metal gate electrode according to embodiments of the present invention.
Figure 2B:
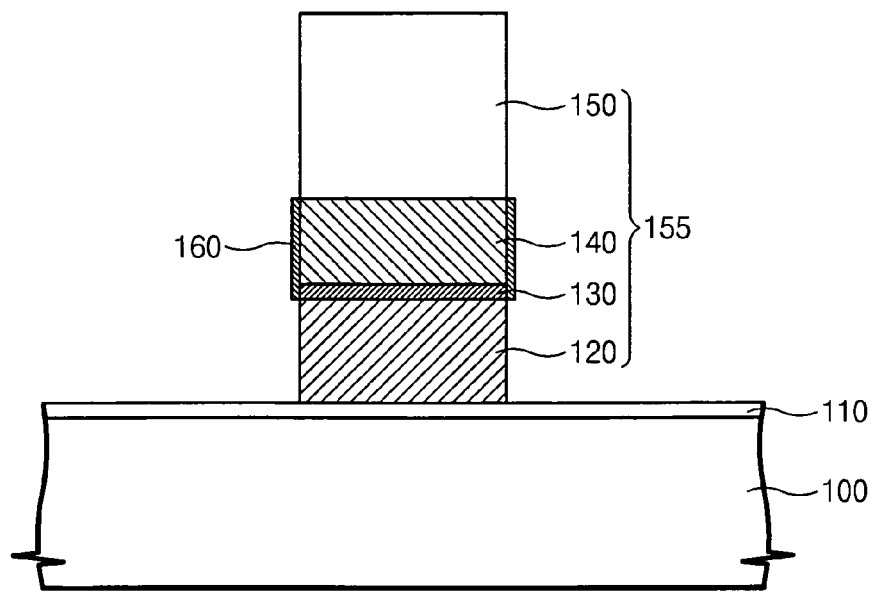
Figure 2C:
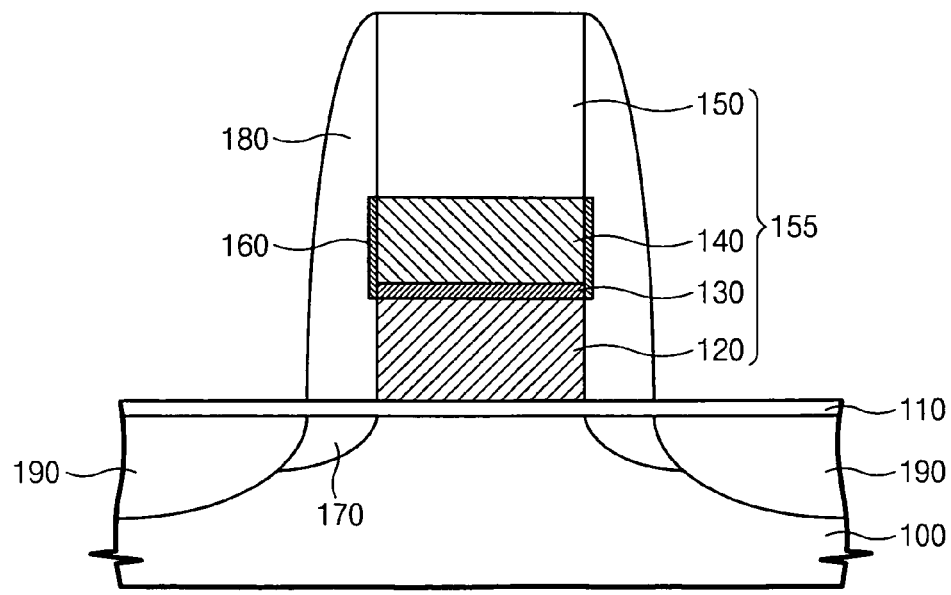

FIGS. 2A through 2C are cross-sectional diagrams sequentially illustrating exemplary operations and/or features of forming a semiconductor device having a metal gate electrode according to embodiments of the present invention.

Referring to FIG. 2A, a gate insulator 110, a gate polysilicon layer 120, a barrier metal layer 130, a metal gate layer 140 and a capping layer 150 can be sequentially stacked on a semiconductor substrate 100. The capping layer 150, the metal gate layer 140, the barrier metal layer 130, and the gate polysilicon layer 120 can be (sequentially) patterned to form a gate pattern 155. As such, the gate pattern 155 can comprise stacked gate layers of corresponding patterns: a polysilicon pattern 120, a barrier metal pattern 130, a metal gate pattern 140, and a capping pattern 150. The terms "layer" and "pattern" may be used interchangeably below to indicate the stacked components on the semiconductor or other base substrate forming the gate pattern.

The gate insulator 110 may be formed by thermally oxidizing the semiconductor substrate 100. The gate insulator 110 may be removed during the patterning process to expose the semiconductor substrate 100, and subsequently formed again by a thermal treatment process. The barrier metal layer 130 may comprise tungsten nitride (WN) and/or titanium nitride (TiN) that may be formed by a physical vapor deposition (PVD) or a chemical vapor deposition (CVD). The metal gate layer 140 may comprise tungsten. The gate polysilicon layer 120 may comprise polysilicon doped by impurities. The capping layer 150 may comprise silicon oxide and/or silicon nitride.

Referring to FIG. 2B, an oxidation barrier layer 160 can be selectively formed on at least portions of the sidewalls of the metal gate pattern 140 and on at least sidewalls (and typically at least a major portion of the primary upper and lower surfaces) of the barrier metal pattern 130. The oxidation barrier layer 160 can comprise metal as a constituent or the constituent forming the oxidation barrier layer 160. In certain embodiments, the oxidation barrier layer 160 may be configured so as to cover substantially only the sidewalls of the metal gate pattern 140. In other embodiments, the oxidation barrier layer 160 may be configured to cover only the lower portion of the sidewall(s) of the metal-gate pattern 140. The oxidation barrier layer 160 may be formed by any suitable process, including but not limited to, chemical vapor deposition (CVD) or atomic layer deposition (ALD).

In particular embodiments, the oxidation barrier layer 160 can be relatively well-deposited (with a desired thickness) on sidewalls of the metal containing layers 130 and 140 but deposited in substantially reduced amounts, regions or thickness on surfaces of other layers, including adjacent layers or patterns 120 and 150 or more remote layer 110. This differential or selectivity may be carried out using differences in chemical properties of materials forming or coating the layers, such as a nucleation rate.

In certain embodiments, in order to form the oxidation barrier layer 160, a metal layer can be (selectively) deposited and the deposited metal layer can be treated to form a metal oxide or metal nitride barrier layer. The oxidation barrier layer 160 can be formed with a thickness of between about 5~100 Å.

In certain embodiments, such as when the oxidation barrier layer 160 is formed of aluminum oxide ($Al_2O_3$), an aluminum layer may be formed substantially only on sidewalls of the metal-containing layers 130 and 140 by supplying methylpyrrolidine alane (MPA) as a source gas and argon (Ar) of as a carrier gas. Typically the Ar is supplied at about 100 sccm, at a temperature of between about 135~145° C. at a pressure of between about 0.1~1.1 Torr for about 5 seconds using a CVD method. The aluminum layer can be naturally oxidized (at pressures at about and/or under atmospheric pressure) to form the aluminum oxide for the oxidation barrier layer 160. The aluminum layer may be selectively deposited on surfaces of the metal containing layers 130, 140 but substantially not on other adjacent layers 110, 120 and 150.

Referring to FIG. 2C, a thermal treatment process can be performed with respect to the semiconductor substrate 100 having the gate pattern 155 with the oxidation barrier layer 160 under an oxygen-enriched environment or ambience, thereby curing etch damage caused during the patterning process (such as results in the pattern shown in FIG. 2A). The thermal treatment process under the oxygen-enriched environment or ambience may be performed by supplying nitrogen ($N_2$) as a carrier gas and supplying hydrogen ($H_2$) and oxygen ($O_2$) at a temperature of between about 750~950° C. In particular embodiments, the ratio of oxygen/hydrogen may be between about 0.5~1.3. The oxidation barrier layer 160 can inhibit and/or prevent oxygen penetration into the metal gate pattern 140 to inhibit formation of an oxide layer between the metal gate pattern 140 and the gate polysilicon pattern 120. This, in turn, may improve reliability and/or operational speed in a semiconductor device, particularly a highly integrated semiconductor device with reduced size gate patterns and/or metal gate electrodes.

Still referring to FIG. 2C, a low concentration impurity-doped region 170 can be formed in the semiconductor substrate 100 at both sides of the gate pattern 155 by using the gate pattern 155 as an ion-implantation mask. The low concentration impurity-doped region 170 may be formed before forming the oxidation barrier layer 160 by implanting impurities using the gate pattern 155 as an ion-implantation mask.

In operation, an insulation layer can be conformably formed at an entire upper surface above the semiconductor substrate 100, extending from where the capping layer 150 or oxidation barrier layer 160 is formed down to the gate insulation layer 110. The insulation layer can be anisotropically etched to form spacers 180 covering sidewalls of the individually stacked layers 120, 130, 140, 150 that together form the sidewalls of the gate pattern 155. The insulation layer may comprise silicon oxide or silicon nitride. A relatively high concentration impurity-doped region 190 can be formed in the semiconductor substrate 100 by using the gate pattern 155 and the spacer 180 as ion-implantation masks.

The gate pattern 155 may include a plurality of opposing sidewalls where the shape of the gate pattern 155 (when viewed from the top) is rectangular, square or other shape with more than one sidewall. However, the gate pattern 155 can include cylindrical, circular, or other shapes with only one sidewall as well as other multi-sided configurations. Hence, in the claims, the term "sidewall(s)" is intended to encompass both these sidewall configurations. In addition, although a respective one gate pattern 155 is illustrated, a highly integrated device can comprise a plurality of the gate patterns 155, repeated on the substrate, as will be understood by one of skill in the art.

Accordingly, methods of forming semiconductor devices according to embodiments of the present invention can form an oxidation barrier layer covering at least a portion of the sidewall of the metal gate pattern layer, thereby inhibiting and/or preventing formation of an oxide layer between the metal gate pattern and the gate polysilicon pattern which may occur due to oxygen penetration in a subsequent process.

What is claimed is:

1. A method of forming a semiconductor device comprising:
    patterning a metal-gate layer and a gate polysilicon layer to form a gate pattern comprising a gate polysilicon pattern and a metal-gate pattern;
    covering sidewalls of the metal-gate pattern with an oxidation barrier layer, wherein the oxidation barrier layer comprises metal; and
    forming the oxidation barrier layer on the sidewall of the metal gate pattern using chemical vapor deposition (CVD) or an atomic layer deposition (ALD).

2. The method of claim 1, wherein the oxidation barrier layer comprises at least one of an oxide, nitride, or oxynitride of the metal.

3. The method of claim 2, wherein the metal comprises at least one of the following: aluminum (Al), tantalum (Ta), titanium (Ti), hafnium (Hf) and gold (Au).

4. A method of forming a semiconductor device comprising:
    patterning a metal-gate layer and a gate polysilicon layer to form a gate pattern comprising a gate polysilicon pattern and a metal-gate pattern;
    covering sidewalls of the metal-gate pattern with an oxidation baffler layer, wherein the oxidation barrier layer comprises metal; and
    sequentially forming a gate insulator layer, a gate polysilicon layer and a metal gate layer on a semiconductor substrate prior to the patterning step,
    wherein the covering step comprises depositing a metal layer and oxidizing or nitrifying the deposited metal layer.

5. The method of claim 4, wherein the oxidation barrier layer has a thickness of between about 5~100 Å.

6. The method of claim 4, further comprising forming a capping layer on the metal-gate layer, wherein the capping layer is patterned when the metal-gate layer and the gate polysilicon layer are sequentially patterned, thereby forming a stacked gate pattern comprising, in serial order, a gate polysilicon pattern, a metal-gate pattern and a capping pattern.

7. The method of claim 4, further comprising forming a spacer layer to substantially cover a sidewall of the gate pattern including about: (a) the sidewall(s) of the polysilicon pattern; (b) sidewall(s) of the oxidation barrier layer over the metal-gate layer; and (c) the sidewall(s) of the capping pattern.

8. The method of claim 4, further comprising forming an impurity-doped region in the semiconductor substrate at opposing sides of the gate pattern using the gate pattern as an ion-implantation mask.

9. The method of claim 4, further comprising thermally treating the semiconductor substrate having the gate pattern with the oxidation barrier layer under an oxygen-enriched environment.

10. The method of claim 9, wherein the thermally treating under the oxygen-enriched environment comprises supplying nitrogen as a carrier gas, oxygen, and hydrogen at a temperature of between about 750~950° C. and a ratio of oxygen/hydrogen of between about 0.5~1.3.

11. A method of forming semiconductor device comprising:
    patterning a metal-gate layer and a gate polysilicon layer to form a gate pattern comprising a gate polysilicon pattern and a metal-gate pattern; and
    covering sidewalls of the metal-gate pattern with an oxidation barrier layer, wherein the oxidation barrier layer comprises metal,
    wherein the oxidation barrier layer comprises aluminum oxide ($Al_2O_3$), and wherein the covering step comprises:
    forming an aluminum layer using a CVD method by supplying methylpyrrolidine alane (MPA) as a source gas and argon (Ar) of 100sccm as a carrier gas at a temperature of between about 135~145° C. and at a pressure of between about 0.1~1.1 Torr; and
    oxidizing the aluminum layer in an enriched oxygen environment.

12. A method of forming a semiconductor device comprising:
    patterning a metal-gate layer and a gate polysilicon layer to form a gate pattern comprising a gate polysilicon pattern and a metal-gate pattern;
    covering sidewalls of the metal-gate pattern with an oxidation barrier layer, wherein the oxidation barrier layer comprises metal; and
    forming a barrier metal layer between the metal gate layer and the polysilicon layer, and wherein the gate pattern comprises a stacked gate polysilicon pattern, barrier metal pattern and metal gate pattern.

13. The method of claim 12, wherein the barrier and/or metal gate layer comprises tungsten.

14. The method of claim 12, wherein the barrier metal layer comprises tungsten or titanium nitride (TiN).

15. The method of claim 12, wherein the oxidation barrier layer is selectively configured to cover substantially only the sidewall(s) of the metal gate layer and the barrier metal layer.

16. A method of forming a metal gate electrode comprising:
    forming a gate pattern comprising a metal-gate pattern on a target substrate;
    depositing a metal layer; and
    oxidizing or nitrifying the deposited metal layer to form an oxidation barrier layer covering sidewalls of the metal-gate pattern.

17. A method according to claim 16, wherein forming a gate pattern comprises:
    forming a polysilicon gate layer and a metal gate layer on the target substrate; and
    patterning the metal gate layer and the polysilicon gate layer to form a polysilicon-gate pattern and the metal-gate pattern.

18. A method according to claim 17, wherein the metal gate layer comprises tungsten and the metal layer comprises aluminum, tantatum, titanium, hafnium, and gold.

19. A method according to claim 17, further comprising forming a barrier metal layer between the polysilicon gate layer and the metal gate layer, and further comprising forming a earning layer on the metal gate layer.

20. A method according to claim 16, wherein depositing a metal layer comprises depositing the metal layer using a chemical vapor deposition or an atomic layer deposition.

21. A method according to claim 16, wherein depositing a metal layer comprises depositing an aluminum layer, and wherein oxidizing or nitrifying the deposited metal layer comprises oxidizing the aluminum layer in an enriched oxygen environment.

22. A method according to claim 16, further comprising thermally treating the target substrate having the gate pattern with the oxidation barrier layer in an oxygen-enriched environment.

23. A method according to claim 22, wherein the thermally treating under the oxygen-enriched environment comprises supplying nitrogen as a carrier gas, oxygen and hydrogen at a temperature of between about 750~950° C. and a ratio of oxygen/hydrogen of between about 0.5~1.3.

24. A method of forming an integrated circuit device having a metal gate electrode comprising:
    forming a stacked gate pattern onto a target substrate, the gate pattern comprising a metal-gate pattern with opposing first and second surfaces and at least one sidewall; and
    covering at least a portion of the at least one sidewall of the metal-gate pattern with an oxidation barrier layer substantially without covering a sidewall of an adjacent gate polysilicon layer with the oxidation barrier layer, wherein the oxidation barrier layer comprises aluminum oxide ($Al_2O_3$), and wherein the covering step comprises:
    forming an aluminum layer using a CVD method by supplying methylpyrrolidine alane (MPA) as a source gas and argon (Ar) as a carrier gas at a temperature above ambient; and
    oxidizing the aluminum layer in an enriched oxygen environment to provide the oxidation barrier layer.

* * * * *

UNITED STATES PATENT AND TRADEMARK OFFICE
CERTIFICATE OF CORRECTION

PATENT NO.        : 7,098,123 B2  
APPLICATION NO.   : 10/780244  
DATED             : August 29, 2006  
INVENTOR(S)       : Heo et al.

Page 1 of 1

It is certified that error appears in the above-identified patent and that said Letters Patent is hereby corrected as shown below:

On the Title Page:
Add
-- (30)  Foreign Application Priority Data
Feb. 19, 2003   (KR)   …………………....2003-0010403 --

Column 7,
Line 57 should read -- layer comprises tungsten nitride (WN) or titanium nitride (TiN). --

Column 8,
Line 23 should read -- forming a capping layer on the metal gate layer. --

Signed and Sealed this

Ninth Day of January, 2007

JON W. DUDAS  
*Director of the United States Patent and Trademark Office*